(12) United States Patent
Kusunoki et al.

(10) Patent No.: US 12,080,613 B2
(45) Date of Patent: Sep. 3, 2024

(54) ELECTRONIC COMPONENT MODULE

(71) Applicant: Murata Manufacturing Co., Ltd., Nagaokakyo (JP)

(72) Inventors: Motohiko Kusunoki, Nagaokakyo (JP); Osamu Yamaguchi, Nagaokakyo (JP); Shinichiro Banba, Nagaokakyo (JP); Takafumi Kusuyama, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 417 days.

(21) Appl. No.: 17/498,389

(22) Filed: Oct. 11, 2021

(65) Prior Publication Data

US 2022/0028750 A1    Jan. 27, 2022

Related U.S. Application Data

(63) Continuation of application No. PCT/JP2020/016326, filed on Apr. 13, 2020.

(30) Foreign Application Priority Data

Apr. 15, 2019 (JP) .................................. 2019-76740

(51) Int. Cl.
*H01L 23/48* (2006.01)
*H01L 23/29* (2006.01)
(Continued)

(52) U.S. Cl.
CPC ............ *H01L 23/29* (2013.01); *H01L 23/367* (2013.01); *H01L 23/40* (2013.01); *H01L 23/552* (2013.01); *H01L 25/072* (2013.01); *H01L 25/18* (2013.01)

(58) Field of Classification Search
CPC ................. H01L 23/367; H01L 23/557; H01L 2225/1094; H01L 21/4882
(Continued)

(56) References Cited

U.S. PATENT DOCUMENTS 5,660,917 A     8/1997  Fujimori et al.
5,909,056 A *   6/1999  Mertol ................ H01L 23/3675
                                                      257/796
(Continued)

FOREIGN PATENT DOCUMENTS

CN   107026107 A   8/2017
JP    3305720 B2   7/2002
(Continued)

OTHER PUBLICATIONS

International Search Report issued in PCT/JP2020/016326, dated Jul. 7, 2020.
(Continued)

*Primary Examiner* — Nitin Parekh
(74) *Attorney, Agent, or Firm* — ArentFox Schiff LLP

(57) ABSTRACT

An electronic component module is provided that includes a substrate, an electronic component, a heat dissipating member, and a sealing resin. The electronic component is mounted on the substrate. The heat dissipating member includes a flat plate and columnar bodies. The sealing resin covers a side of a first main surface of the substrate and the electronic component. Moreover, the heat dissipating member, except for a top surface of the flat plate, is covered with the sealing resin. The columnar bodies are disposed at an outer peripheral of the flat plate, and have a shape protruding from a bottom surface of the flat plate. The columnar bodies include a root connected to the flat plate, and a tip connected to the substrate. In a plan view of the electronic component module, the tip is not outside the root.

19 Claims, 13 Drawing Sheets

(51) Int. Cl.
  *H01L 23/367* (2006.01)
  *H01L 23/40* (2006.01)
  *H01L 23/552* (2006.01)
  *H01L 25/07* (2006.01)
  *H01L 25/18* (2023.01)

(58) Field of Classification Search
  USPC .................................... 257/706, 707, 713
  See application file for complete search history.

(56) References Cited

U.S. PATENT DOCUMENTS

| | | | | |
|---|---|---|---|---|
| 5,977,626 | A | | 11/1999 | Wang et al. |
| 5,982,621 | A | * | 11/1999 | Li .......................... H01L 23/367 |
| | | | | 361/704 |
| 5,990,418 | A | * | 11/1999 | Bivona ................... H01L 23/16 |
| | | | | 174/547 |
| 6,114,761 | A | * | 9/2000 | Mertol ................... H01L 23/367 |
| | | | | 257/722 |
| 6,229,702 | B1 | * | 5/2001 | Tao ..................... H01L 23/4334 |
| | | | | 257/796 |
| 6,281,573 | B1 | * | 8/2001 | Atwood .............. H01L 23/3675 |
| | | | | 257/710 |
| 6,369,455 | B1 | * | 4/2002 | Ho ...................... H01L 23/4334 |
| | | | | 257/730 |
| 6,429,512 | B1 | * | 8/2002 | Huang ................ H01L 23/4334 |
| | | | | 257/796 |
| 6,432,749 | B1 | * | 8/2002 | Libres ................. H01L 23/3121 |
| | | | | 257/E23.125 |
| 6,891,732 | B2 | | 5/2005 | Takano et al. |
| 7,964,951 | B2 | * | 6/2011 | Refai-Ahmed ......... H01L 23/10 |
| | | | | 257/777 |
| 8,030,755 | B2 | * | 10/2011 | Lee ..................... H01L 23/4334 |
| | | | | 257/796 |
| 8,811,028 | B2 | | 8/2014 | Ikemoto |
| 10,772,244 | B2 | | 9/2020 | Otsumbo et al. |
| 2003/0058630 | A1 | | 3/2003 | Takano et al. |
| 2004/0012099 | A1 | | 1/2004 | Nakayama et al. |
| 2006/0292741 | A1 | | 12/2006 | Tseng et al. |
| 2008/0217753 | A1 | * | 9/2008 | Otani ................... H01L 23/3128 |
| | | | | 438/126 |
| 2010/0230805 | A1 | | 9/2010 | Refai-Ahmed et al. |
| 2011/0018114 | A1 | * | 1/2011 | Pagaila .................... H01L 24/97 |
| | | | | 257/E23.101 |
| 2011/0157852 | A1 | | 6/2011 | Ikemoto |
| 2018/0092257 | A1 | | 3/2018 | Otsumbo et al. |

FOREIGN PATENT DOCUMENTS

| | | |
|---|---|---|
| JP | 2003249607 A | 9/2003 |
| JP | 2004327556 A | 11/2004 |
| JP | 2005203633 A | 7/2005 |
| JP | 3817453 B2 | 9/2006 |
| JP | 2011134941 A | 7/2011 |
| JP | 2012028484 A | 2/2012 |
| JP | 5661095 B2 | 1/2015 |
| JP | 2017139278 A | 8/2017 |
| WO | 2010105346 A1 | 9/2010 |
| WO | 2016181954 A1 | 11/2016 |
| WO | 2018101383 A1 | 6/2018 |

OTHER PUBLICATIONS

Written Opinion of the International Search Report issued in PCT/JP2020/016326, dated Jul. 7, 2020.

Chinese Office Action issued for Chinese Patent Application No. 202090000479.8, date of issuance of Chinese Office Action Feb. 9, 2022.

* cited by examiner

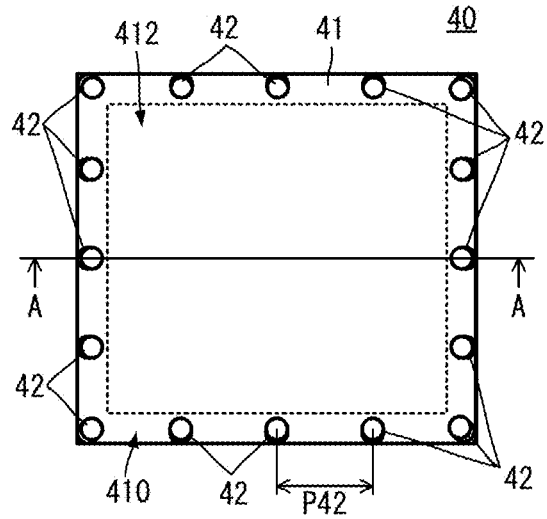
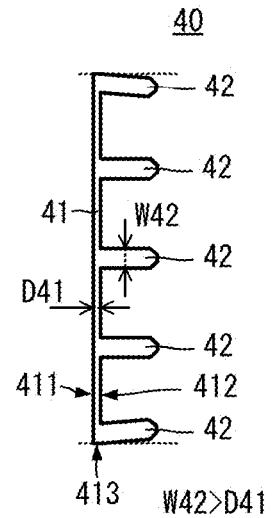
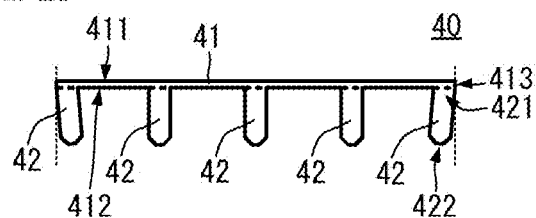
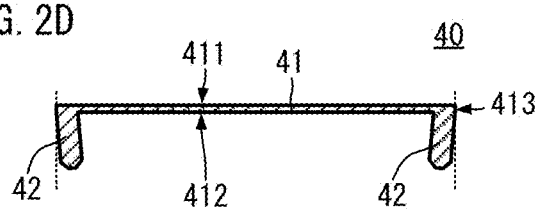
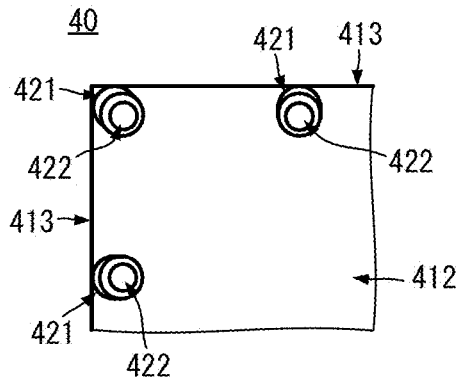

ELECTRONIC COMPONENT MODULE

CROSS REFERENCE TO RELATED APPLICATIONS

The present application is a continuation of PCT/JP2020/016326 filed Apr. 13, 2020, which claims priority to Japanese Patent Application No. 2019-076740, filed Apr. 15, 2019, the entire contents of each of which are incorporated herein by reference.

TECHNICAL FIELD

The present invention relates to an electronic component module including a heat generating component.

BACKGROUND

Patent Literatures 1 to 3 (identified below) disclose a heat dissipation structure of an IC mounted on a substrate. In the configuration of Patent Literatures 1 to 3, the IC is sealed with a sealing member or a resin. The configuration of the structured described in Patent Literatures 1 to 3 includes a heat dissipation plate that dissipates heat from the IC.

More particularly, Patent Literature 1 discloses a configuration in which the heat dissipation plate is in contact with a top surface of the IC, and a portion of an outer periphery of the heat dissipation plate is curved toward the substrate and bonded to the substrate. Patent Literature 2 discloses a configuration in which the heat dissipation plate is disposed to face the top surface of the IC through a sealing member. Patent Literature 3 discloses a configuration in which the heat dissipation plate is adhered to the top surface of the IC by an adhesive agent. In the configuration of Patent Literatures 1 to 3, the top surface (i.e., a surface opposite to the IC) of the heat dissipation plate is exposed to the outside of a sealing resin.

Patent Literature 1: U.S. Pat. No. 5,977,626. Patent Literature 2: U.S. Pat. No. 2006/0292741. Patent Literature 3: Japanese Unexamined Patent Application Publication No. 2004-327556.

However, in the configuration disclosed in Patent Literatures 1 to 3, the heat dissipation plate and the sealing resin may be separated due to a difference in linear expansion coefficients between the heat dissipation plate and the sealing resin. As a result, a gap is generated between the heat dissipation plate and the sealing resin, and thus reliability is reduced.

SUMMARY OF THE INVENTION

In view of the above, exemplary embodiments of the present invention are provided to significantly reduce or prevent generation of a gap between a heat dissipation plate and a sealing resin and to also improve reliability.

Accordingly, an electronic component module of the present invention is provided that includes a substrate, a first electronic component, a heat dissipating member, and a first sealing resin. The substrate includes a first main surface and a second main surface that face each other. The first electronic component is mounted on the first main surface of the substrate, and is a heat generating component. Moreover, the heat dissipating member is disposed so as to overlap the first electronic component in a plan view of the first main surface of the substrate. The first sealing resin is disposed near the first main surface of the substrate, covers the first main surface and the first electronic component, and includes a portion in contact with the heat dissipating member.

Moreover, in an exemplary aspect, the heat dissipating member includes a main body portion and an auxiliary portion. The main body portion is disposed opposite to the substrate with respect to the first electronic component. The auxiliary portion is connected to the outer peripheral portion of the main body portion and protrudes from the main body portion toward the substrate. In addition, the auxiliary portion includes a root portion connected to the main body portion, and a tip portion on an opposite side of the root portion. At least a portion of the tip portion of the auxiliary portion is connected to the substrate. Furthermore, the auxiliary portion, in a plan view of the main body portion, tilts so that a position of at least a portion of the tip portion is more inside the main body portion than a position of the root portion.

With this configuration, contraction of the main body portion is significantly reduced or prevented by the auxiliary portion. As a result, separation of an adhesive surface between the heat dissipating member and the first sealing resin is significantly reduced or prevented.

According to the exemplary embodiment of the present invention, generation of a gap between a heat dissipation plate and a sealing resin is significantly reduced or prevented, and reliability is improved.

BRIEF DESCRIPTION OF DRAWINGS

FIG. 2A is a plan view of a heat dissipating member, FIG. 2B is a first side view of the heat dissipating member, FIG. 2C is a second side view of the heat dissipating member, FIG. 2D is an A-A cross-sectional view of the heat dissipating member, and FIG. 2E is an enlarged plan view showing a portion of the heat dissipating member.

DETAILED DESCRIPTION OF EXEMPLARY EMBODIMENTS

First Exemplary Embodiment

Figure 1A:
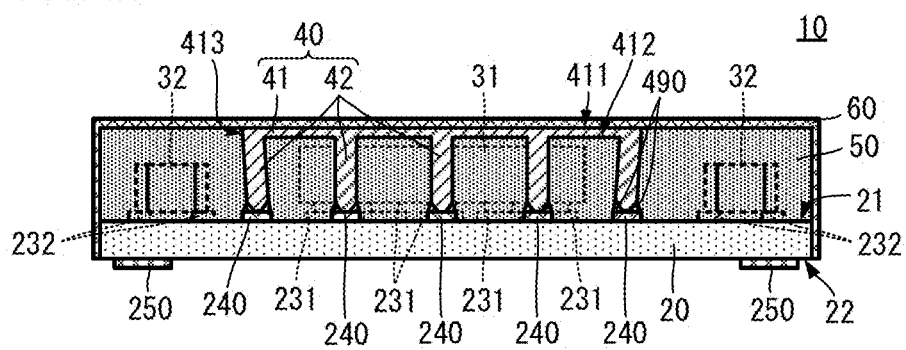
FIG. 1A is a side cross-sectional view showing a configuration of an electronic component module according to a first exemplary embodiment.
Figure 1B:
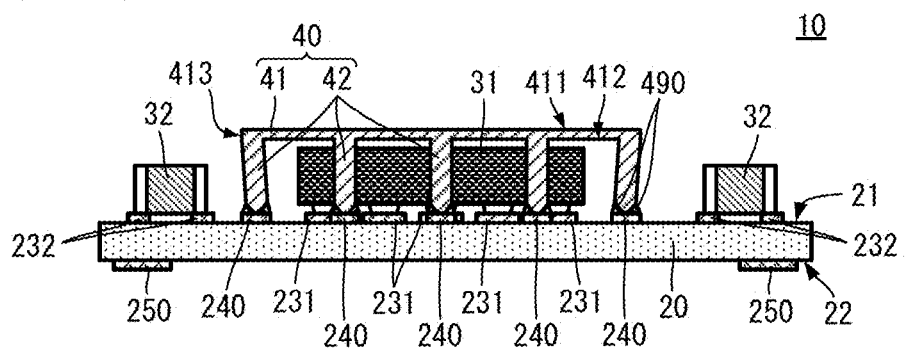
FIG. 1B is a side cross-sectional view of the electronic component module from which a sealing resin and a shield member are omitted.
Figure 1C:
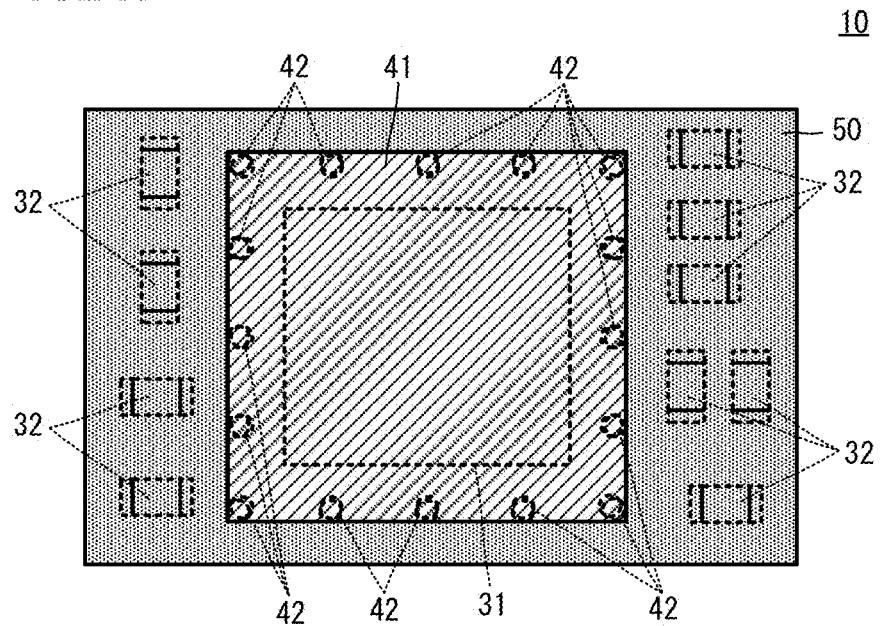
FIG. 1C is a plan view of the electronic component module from which the shield member is omitted.

An electronic component module according to a first exemplary embodiment will be described with reference to drawings. FIG. 1A is a side cross-sectional view showing a configuration of an electronic component module according to the first exemplary embodiment. FIG. 1B is a side cross-sectional view of the electronic component module according to the first exemplary embodiment from which a sealing resin and a shield member are omitted. FIG. 1C is a plan view of the electronic component module according to the first exemplary embodiment from which the shield member is omitted.

As shown in FIG. 1A, FIG. 1B, and FIG. 1C, an electronic component module 10 includes a substrate 20, an electronic component 31, a plurality of electronic components 32, a heat dissipating member 40, a sealing resin 50, and a shield member 60. For purposes of this disclosure, the electronic component 31 corresponds to a "first electronic component", and the electronic component 32 corresponds to a "second electronic component". Moreover, the sealing resin 50 corresponds to a "first sealing resin". It is noted that the number of electronic components 31 and electronic components 32 is not limited to what is shown in the present exemplary embodiment.

As shown, the substrate 20 includes a first main surface 21, a second main surface 22, and a side surface. A main body of the substrate 20 is an insulator. Moreover, a predetermined electrode pattern is provided on the insulator. The first main surface 21 and the second main surface 22 face (i.e., oppose) each other. The substrate 20, although being a ceramic substrate, may be a resin substrate in another exemplary aspect. In addition, the substrate 20 may be a multilayer substrate. The substrate 20 includes a plurality of electronic component electrodes 231, a plurality of electronic component electrodes 232, a plurality of heat dissipating member electrodes 240, and a plurality of external connection electrodes 250. The plurality of electronic component electrodes 231, the plurality of electronic component electrodes 232, and the plurality of heat dissipating member electrodes 240 are provided on the first main surface 21. The plurality of external connection electrodes 250 are provided on the second main surface 22. The plurality of electronic component electrodes 231, the plurality of electronic component electrodes 232, the plurality of heat dissipating member electrodes 240, and the plurality of external connection electrodes 250 are connected by an electrode pattern provided on the substrate 20. In such a case, the electrode pattern is provided so that a circuit configuration of the electronic component module 10 may be achieved. The plurality of electronic component electrodes 231 are disposed inside an area surrounded by the plurality of heat dissipating member electrodes 240. The plurality of electronic component electrodes 232 are disposed outside the area surrounded by the plurality of heat dissipating member electrodes 240.

According to an exemplary aspect, the electronic component 31 is a heat generating component having a high heat generation property. For example, the electronic component 31 may be an IC using a semiconductor substrate, or an elastic wave filter using a piezoelectric substrate. The electronic component 31 has a flat plate shape, for example, and includes a mounting surface, and a top surface opposite to the mounting surface. A function portion of the electronic component 31 is provided near the mounting surface. The electronic component is mounted on the plurality of electronic component electrodes 231 by use of using solder or the like.

Moreover, a plurality of electronic components 32 are electronic components having a low heat generation property, as compared with the electronic component 31. For example, the electronic component 32 can be a chip-type mounted component such as a resistance element, an inductor element, and/or a capacitor element. The electronic component 32 is mounted on the plurality of electronic component electrodes 232 by use of solder or the like.

The heat dissipating member 40 includes a flat plate portion 41 (or simply referred to as a flat plate) and a plurality of columnar bodies 42. The flat plate portion 41 corresponds to a "main body portion" or "main body" of the present disclosure, and the columnar body 42 corresponds to the "auxiliary portion" of the present disclosure. In an exemplary aspect, the heat dissipating member 40 is made of a material with high thermal conductivity, and made of copper (Cu), for example. The flat plate portion 41 and the plurality of columnar bodies 42 are integrally formed.

The flat plate portion 41, in a plan view of the first main surface 21 and the second main surface 22 of the substrate 20, overlaps the electronic component 31, and does not overlap the plurality of electronic components 32. The flat plate portion 41 includes a top surface 411 and a bottom surface 412. The bottom surface 412 is adjacent to a top surface of the electronic component 31 and is disposed substantially parallel to the top surface.

The plurality of columnar bodies 42 have a shape protruding from the bottom surface 412 (e.g., a flat plate surface) of the flat plate portion 41. The plurality of columnar bodies 42 are disposed with a distance along an outer periphery of the flat plate portion 41. The plurality of columnar bodies are mounted on the plurality of heat dissipating member electrodes 240 by use of a bonding material 490, for example.

According to this configuration, the top surface and side surface of the electronic component 31 are surrounded by the heat dissipating member 40. In such a case, the top surface of the electronic component 31 and the flat plate portion 41 of the heat dissipating member 40 are opposed to each other over a predetermined area, and adjacent to each other. Therefore, heat generated in the electronic component 31 is efficiently propagated to the flat plate portion 41 of the heat dissipating member 40. It is noted that a more specific shape of the heat dissipating member 40 will be described later.

In the exemplary aspect, the sealing resin 50 is made of an insulating resin. The sealing resin 50 covers a side of the first main surface 21 of the substrate 20. More specifically, the sealing resin 50 covers the first main surface 21 of the substrate 20, the electronic component 31, and the plurality of electronic components 32.

Furthermore, the sealing resin 50 covers a portion of the heat dissipating member 40 except for the top surface. More specifically, the sealing resin 50 covers a side surface and bottom surface of the flat plate portion 41 of the heat dissipating member 40, and the auxiliary portion (i.e., the plurality of columnar bodies 42). Then, the top surface of the sealing resin 50 and the top surface of the flat plate portion 41 are flush with each other.

Herein, as described above, the heat dissipating member 40 includes a configuration in which the plurality of columnar bodies 42 are disposed with a distance. As a result, the sealing resin 50 easily enters from the outside to inside of the heat dissipating member 40. Therefore, a shape to cover the electronic component 31 is easily achieved by the sealing resin 50, and the sealing resin 50 also easily enters in between the electronic component 31 and the flat plate portion 41. As a result, the reliability of the electronic component module 10 is improved. Furthermore, the heat from the electronic component 31 to the flat plate portion 41 of the heat dissipating member 40 is efficiently propagated.

Moreover, according to the exemplary aspect, the shield member 60 is made of a film having conductivity. The shield member 60 is a metal film, for example, and is made of a material that blocks electromagnetic waves. It is noted that the shield member 60, although being able to be omitted, is preferably provided.

The shield member 60 contacts the top surface of the sealing resin 50, and the top surface 411 of the flat plate portion 41. In addition, the shield member 60 contacts the side surface of the sealing resin 50, and the side surface of the substrate 20. In other words, the shield member 60 covers the side of the first main surface 21 of the substrate 20 in the electronic component module 10, and the side surface of the substrate 20.

With such a configuration, the electronic component module 10 efficiently propagates heat generated by the electronic component 31, to the heat dissipating member 40, and thus dissipates the heat of the electronic component 31. In such a case, the top surface of the flat plate portion 41 is exposed to the outside of the sealing resin 50. As a result, the heat propagated to the flat plate portion 41 is propagated to the outside of the sealing resin 50, and is then dissipated.

Furthermore, the top surface 411 of the flat plate portion 41 is surface-connected to the shield member 60. As a result, the shield member 60 is also configured for heat dissipation. Therefore, the heat propagated to the flat plate portion 41 is further more effectively dissipated.

In addition, the plurality of columnar bodies 42 of the heat dissipating member 40 are mounted on the substrate 20. As a result, the heat is also propagated to the substrate 20 through the plurality of columnar bodies 42 and is dissipated. Therefore, the heat dissipation property of the electronic component module 10 is further improved.

While having the above high heat dissipation property, the electronic component module 10 also has high reliability according to the structure of the heat dissipating member 40 that is specifically shown below.

Configuration of Heat Dissipating Member 40

Figure 3:
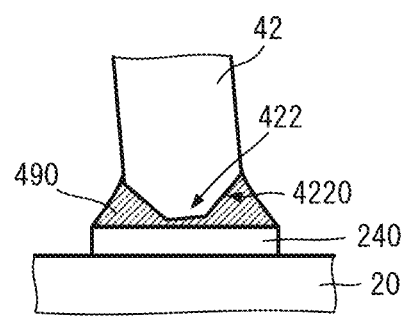
FIG. 3 is an enlarged view of a bonded portion between the heat dissipating member and a substrate.

FIG. 2A is a plan view of the heat dissipating member according to the first exemplary embodiment, and FIG. 2B is a first side view of the heat dissipating member. FIG. 2C is a second side view of the heat dissipating member, and FIG. 2D is an A-A cross-sectional view of the heat dissipating member. FIG. 2E is an enlarged plan view showing a portion of the heat dissipating member. FIG. 3 is an enlarged view of a bonded portion between the heat dissipating member and a substrate.

As described using FIG. 1A to FIG. 1C, and shown in FIG. 2A to FIG. 2E, the heat dissipating member 40 includes a flat plate portion 41 and a plurality of columnar bodies 42. The flat plate portion 41 and the plurality of columnar bodies 42 are integrally formed.

The flat plate portion 41 includes a top surface 411, the bottom surface 412, and the side surface 413. The flat plate portion 41 has a rectangular shape in a plan view. An area of the flat plate portion 41, that is, an area of the top surface 411 and the bottom surface 412, is larger than an area of the electronic component 31 in a plan view.

The plurality of columnar bodies 42 are substantially circular cylinders in the exemplary embodiment. The plurality of columnar bodies 42 are connected to the bottom surface 412 of the flat plate portion 41. The plurality of columnar bodies 42 each have a root portion 421 (or simply referred to as a root) and a tip portion 422 (or simply referred to as a tip). The root portion 421 is a portion at which the columnar body 42 is connected to the bottom surface 412 of the flat plate portion 41. The tip portion 422, in a direction in which the columnar body 42 extends, is an end portion opposite to the root portion 421.

The plurality of columnar bodies 42 are disposed at the outer peripheral portion 410 of the flat plate portion 41. The outer peripheral portion 410 is a frame-shaped portion with a constant width along an outer periphery. The width of the outer peripheral portion 410 is larger than a width (i.e., a diameter) of the columnar body 42, for example, and is a size in which the electronic component 31 is accommodated in an area surrounded by the outer peripheral portion 410 in a plan view.

The plurality of columnar bodies 42 are disposed with a distance P42 along the outer periphery of the flat plate portion 41. For example, as shown in FIG. 2A to FIG. 2E, the plurality of columnar bodies 42 are disposed at four corner portions of the flat plate portion 41, and are also disposed with the distance P42 along a side that connects each corner portion.

Furthermore, as shown in FIG. 2A to FIG. 2E, the plurality of columnar bodies 42 are disposed in a shape tilted inside, in a plan view (i.e., in a plan view of the flat plate portion 41) of the heat dissipating member 40. In other words, in the plurality of columnar bodies 42, the position of the tip portion 422 is closer to the center than the outer periphery of the flat plate portion 41, with respect to the position of the root portion 421. In other words, in a plan view of the flat plate portion 41 of the heat dissipating member 40, the position of the tip portion 422 is not more outside than the position of the root portion 421 and the tip portions 422 tilt inwards.

According to such a configuration, the plurality of columnar bodies 42 significantly reduce or prevent deformation (e.g., contraction due to thermal history, for example) of the flat plate portion 41 in a direction parallel to the top surface 411 and the bottom surface 412. In other words, the plurality of columnar bodies 42 have an anchor effect against the deformation of the flat plate portion 41 in the direction parallel to the top surface 411 and the bottom surface 412.

Therefore, even when the thermal history is applied while the sealing resin 50 is in contact with the side surface 413 of the flat plate portion 41, the deformation of the flat plate portion 41 is significantly reduced or prevented, and separation on a contact surface with the sealing resin 50 is significantly reduced or prevented. As a result, the electronic component module 10 achieves high reliability. However, it is noted that while in the present embodiment, all the columnar bodies are formed so as to be tilted to the inside, at least one columnar body may be tilted to the inside in a refinement of the exemplary embodiment.

It is also noted that, in a plan view, the position of the tip portion 422 may overlap the position of the root portion 421. In other words, the direction in which the columnar body 42 extends may be perpendicular to the bottom surface 412 of the flat plate portion 41. However, as described above, the plurality of columnar bodies 42 have a shape tilted to the inside of the flat plate portion 41, so that the anchor effect is better produced and is more suitable. In addition, the plurality of columnar bodies 42 may have a mixture of a configuration that tilts inside and a configuration that is perpendicular to the bottom surface 412.

Furthermore, the plurality of columnar bodies 42 are bonded to the substrate 20. As a result, the anchor effect against the deformation of the flat plate portion 41 by the plurality of columnar bodies 42 is improved. Therefore, the reliability of the electronic component module 10 is further improved.

In addition, the width (i.e., the diameter) W42 of the plurality of columnar bodies 42 is preferably larger than the thickness D41 of the flat plate portion 41. As a result, the anchor effect against the deformation of the flat plate portion 41 by the plurality of columnar bodies 42 is improved. Therefore, the reliability of the electronic component module 10 is further improved. In addition, the length of the plurality of columnar bodies 42 is preferably larger than the thickness D41 of the flat plate portion 41. As a result, the anchor effect against the deformation of the flat plate portion 41 by the plurality of columnar bodies 42 is improved. Therefore, the reliability of the electronic component module 10 is further improved. Then, as with the above, by reducing the thickness D41 of the flat plate portion 41, the height of the electronic component module 10 is reduced. In other words, this configuration achieves a low-profile electronic component module 10.

In addition, the distance P42 between adjacent columnar bodies 42 is preferably less than or equal to half (½) a wavelength of electromagnetic wave noise generated from the electronic component 31, for example. In the exemplary aspect, the plurality of columnar bodies 42 are made of metal, so that this configuration is able to significantly reduce or prevent the electromagnetic wave noise generated by the electronic component 31 from affecting other components or the outside. In addition, the distance P42, for example, is preferably less than or equal to half (½) a wavelength of electromagnetic wave noise from the outside that affects the electronic component 31. With this configuration, the influence of the electromagnetic wave noise from the outside to the electronic component 31 is significantly reduced or prevented.

In addition, as shown in FIG. 2A to FIG. 2E and FIG. 3, the tip portion 422 of the plurality of columnar bodies 42 has a tapered shape 4220. As a result, as shown in FIG. 3, between the heat dissipating member electrode 240 and the tip portion 422 of the columnar body 42, a central area with a small gap height and a peripheral area that surrounds the central area and has the height of a gap that is increased gradually toward the outside, are provided.

According to such a configuration, the bonding material 490 (e.g., as shown in FIG. 3) easily flows in between the heat dissipating member electrode 240 and the tip portion 422. Therefore, it is unlikely that a void generated inside the bonding material 490 between the tip portion 422 and the heat dissipating member electrode 240. As a result, the reliability of bonding between the heat dissipating member 40 and the heat dissipating member electrode 240 is improved, and then the reliability of the electronic component module 10 is improved.

In addition, in the above configuration, the heat dissipating member 40, as one type of mounted components, is mounted on the substrate 20 with the electronic component 31 and the electronic component 32. As a result, the heat dissipating member 40 is positioned and mounted with high accuracy with respect to the electronic component 31.

It is noted that a specific manufacturing method of the electronic component module 10 is as follows, for example. First, the electronic component 31 and the electronic component 32 are attached to the substrate 20 by use of cream solder or the like. Subsequently, the heat dissipating member 40 is attached to the substrate 20 by use of cream solder or the like. Then, the substrate 20 to which the electronic component 31, the electronic component 32, and the heat dissipating member 40 are attached is subjected to a reflow treatment. As a result, the electronic component 31, the electronic component 32, and the heat dissipating member 40 are bonded (e.g., mounted) to the substrate 20. Then, after a cleaning process or the like, the sealing resin 50 is applied to a side of the first main surface 21 of the substrate 20, and the sealing resin 50 is cured. Subsequently, the sealing resin 50 is ground from the top surface to expose the flat plate portion 41 of the heat dissipating member 40. In such a case, a portion of the flat plate portion 41 may be ground. Accordingly, the flat plate portion 41 is able to be formed to be thin. Subsequently, the shield member 60 is provided so as to cover the flat plate portion 41, the sealing resin 50, and the side surface of the substrate 20.

Derived Example of Heat Dissipating Member

Figure 4A:
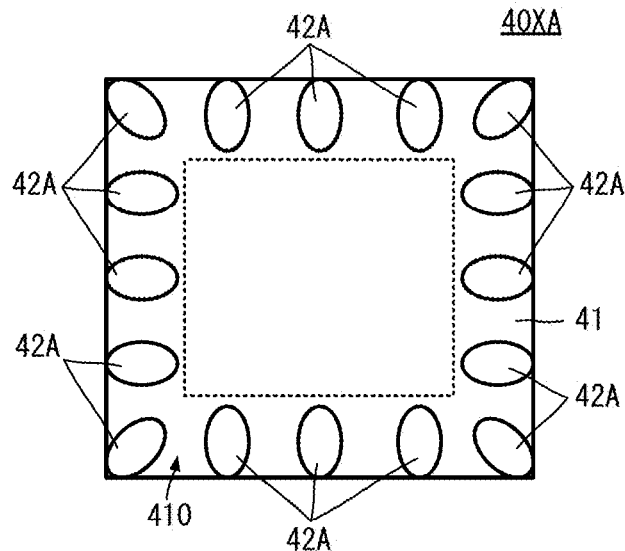
FIG. 4A, FIG. 4B, and FIG. 4C are views each showing a derived example of the heat dissipating member.
Figure 4B:
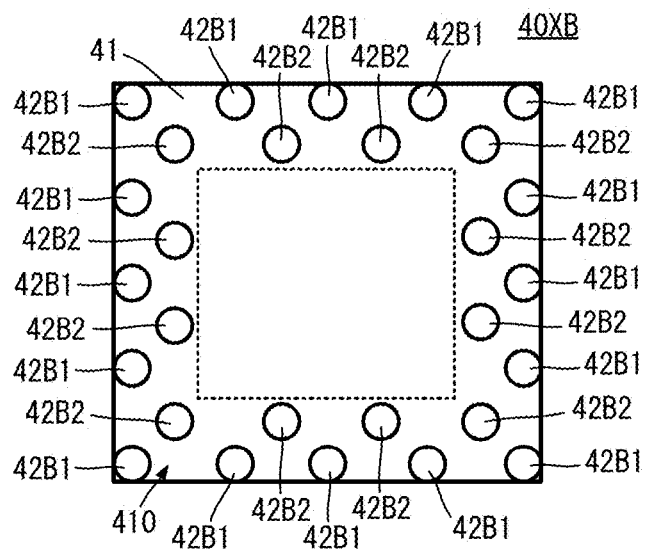
Figure 4C:
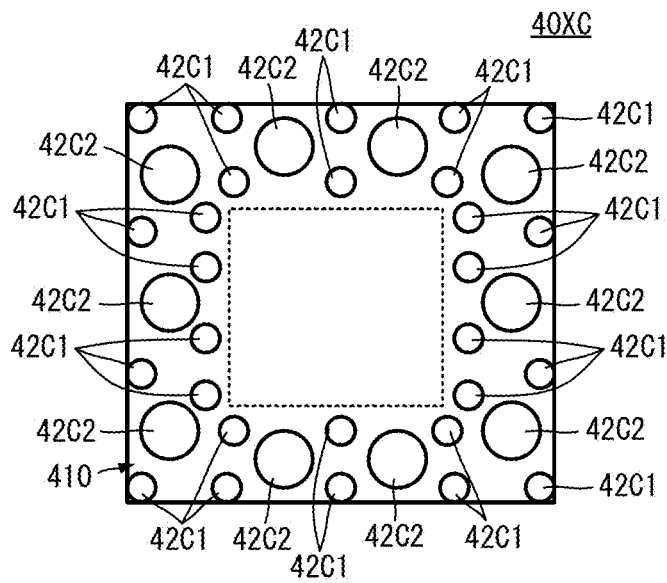

FIG. 4A, FIG. 4B, and FIG. 4C are views each showing a derived example of the heat dissipating member. The basic configuration of each heat dissipating member is the same as the configuration of the heat dissipating member 40, and, hereinafter, only differences from the heat dissipating member 40 will be described.

A heat dissipating member 40XA shown in FIG. 4A includes a flat plate portion 41 and a plurality of columnar bodies 42A. In this exemplary aspect, the plurality of columnar bodies 42A are elliptical columns. In other words, a cross-section of the plurality of columnar bodies 42A has an elliptical shape. The major axis of a columnar body 42A is parallel to a direction from the outside to the center of the flat plate portion 41. The minor axis of the columnar body 42A is perpendicular to the major axis, and thus is perpendicular to the direction from the outside to the center of the flat plate portion 41.

According to such a configuration, the plurality of columnar bodies 42A, that is, the auxiliary portion has a large cross-sectional area. As a result, the deformation of the flat plate portion 41 is significantly reduced or prevented, and the reliability of the electronic component module 10 is improved. Furthermore, with this configuration, a reduction in the distance between adjacent columnar bodies 42 is significantly reduced or prevented. Therefore, the sealing resin 50 is significantly reduced or prevented from being difficult to enter the periphery of the electronic component 31.

A heat dissipating member 40XB shown in FIG. 4B includes a flat plate portion 41, a plurality of columnar bodies 42B1, and a plurality of columnar bodies 42B2. The shape of the plurality of columnar bodies 42B1 is the same as the shape of the plurality of columnar bodies 42. The arrangement pattern of the plurality of columnar bodies 42B1 is the same as the arrangement pattern of the plurality of columnar bodies 42. The shape of the plurality of columnar bodies 42B2 is the same as the shape of the plurality of columnar bodies 42. The plurality of columnar bodies 42B2 are disposed closer to the center than the plurality of columnar bodies 42B1 with respect to the flat plate portion 41. At this time, the plurality of columnar bodies 42B are also disposed with a distance along the outer periphery of the flat plate portion 41. In other words, the plurality of columnar bodies 42B1 and the plurality of columnar bodies 42B2 are disposed in two rows (e.g., two or more rows). Furthermore, the plurality of columnar bodies 42B2 are disposed not to completely overlap the plurality of columnar bodies 42B1, in a side view of the heat dissipating member 40XB in a direction perpendicular to each side. In other words, the plurality of columnar bodies 42B1 and the plurality of columnar bodies 42B2 are arranged in a so-called staggered manner.

According to such a configuration, the auxiliary portion configured by the plurality of columnar bodies 42B1 and the plurality of columnar bodies 42B2 has a large cross-sectional area. As a result, the deformation of the flat plate portion 41 is significantly reduced or prevented, and the reliability of the electronic component module 10 is improved. Furthermore, with this configuration, a reduction in the distance between adjacent columnar bodies 42B1 and the distance between adjacent columnar bodies 42B2 is significantly reduced or prevented. Therefore, the sealing resin 50 is significantly reduced or prevented from being difficult to enter the periphery of the electronic component 31.

A heat dissipating member 40XC shown in FIG. 4C includes a flat plate portion 41, a plurality of columnar bodies 42C1, and a plurality of columnar bodies 42C2. The shape of the plurality of columnar bodies 42C1 is the same as the shape of the plurality of columnar bodies 42. The shape of the plurality of columnar bodies 42C2 is the same as the shape of the plurality of columnar bodies 42, except for a cross-sectional area. The cross-sectional area of the plurality of columnar bodies 42C2 is larger than the cross-sectional area of the plurality of columnar bodies 42C1. The plurality of columnar bodies 42C1 and the plurality of columnar bodies 42C2 are arranged in a predetermined pattern, for example, in the staggered pattern as described above. In such a case, a distance between adjacent columnar bodies in the plurality of columnar bodies 42C1 and the plurality of columnar bodies 42C2, as described above, is set to such an extent that a significant reduction in a flow of the sealing resin 50 does not occur.

According to such a configuration, the auxiliary portion configured by the plurality of columnar bodies 42C1 and the plurality of columnar bodies 42C2 has a large cross-sectional area. As a result, the deformation of the flat plate portion 41 is significantly reduced or prevented, and the reliability of the electronic component module 10 is improved. Furthermore, with this configuration, a reduction in the distance between adjacent columnar bodies 42C1 and the distance between adjacent columnar bodies 42C2 is significantly reduced or prevented. Therefore, the sealing resin 50 is significantly reduced or prevented from being difficult to enter the periphery of the electronic component 31.

It is noted that the derived configurations can also be appropriately combined. In addition, a cross-section of a columnar body may be a polygonal shape such as a rectangle or columnar bodies having a plurality of types of cross-sectional shapes may be mixed. In addition, the arrangement position and the distance of the columnar bodies, although being shown in a regularly symmetrical state in the figure, may be in an asymmetrical state in which the arrangement position and the distance are changed, depending on places.

Second Exemplary Embodiment

Figure 5:
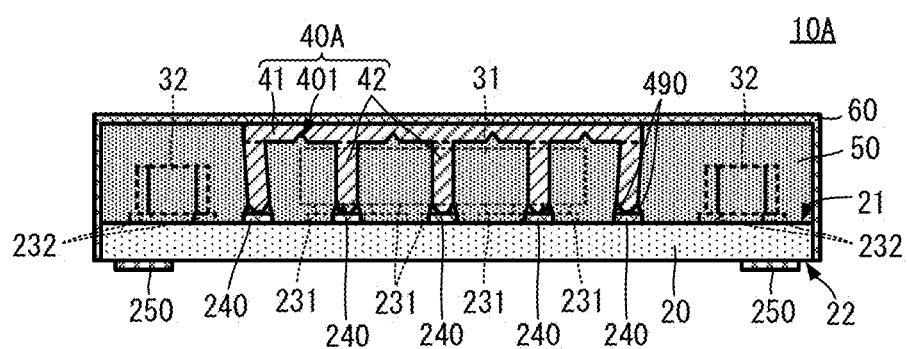
FIG. 5 is a side cross-sectional view showing a configuration of an electronic component module according to a second exemplary embodiment.
Figure 6A:
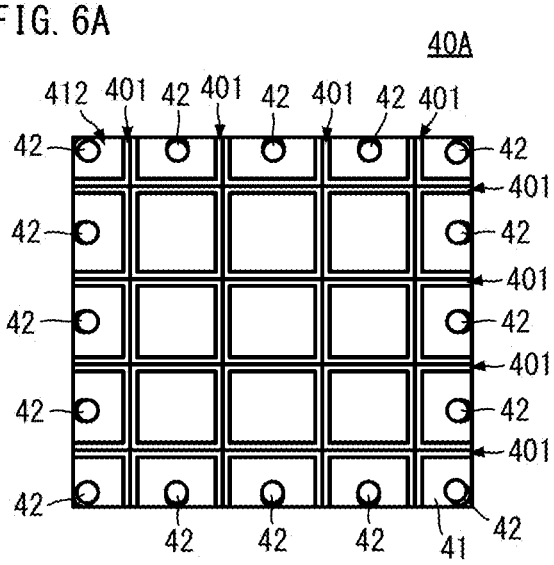
FIG. 6A is a plan view of a heat dissipating member according to the second exemplary embodiment.
Figure 6C:
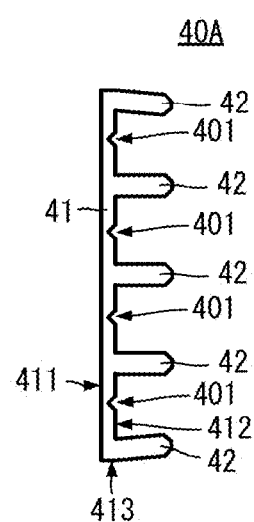
FIG. 6C is a second side view of the heat dissipating member.
Figure 6B:
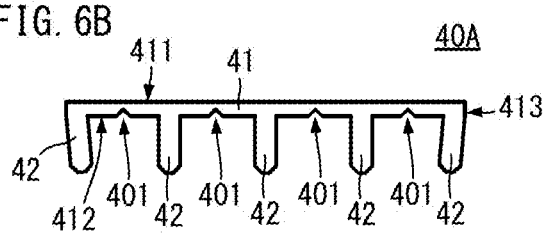
FIG. 6B is a first side view of the heat dissipating member.

An electronic component module according to a second exemplary embodiment will be described with reference to drawings. FIG. 5 is a side cross-sectional view showing a configuration of the electronic component module according to the second exemplary embodiment. FIG. 6A is a plan view of a heat dissipating member according to the second exemplary embodiment, FIG. 6B is a first side view of the heat dissipating member, and FIG. 6C is a second side view of the heat dissipating member.

As shown in FIG. 5, FIG. 6A, FIG. 6B, and FIG. 6C, an electronic component module 10A according to the second exemplary embodiment is different in a configuration of a heat dissipating member 40A from the electronic component module 10 according to the first exemplary embodiment. Other configurations of the electronic component module 10A are the same as or similar to the configurations of the electronic component module 10, and a description of the same or similar configuration will be omitted.

The electronic component module 10A includes a heat dissipating member 40A that includes a flat plate portion 41 and a plurality of columnar bodies 42. A plurality of concave portions 401 are provided on the bottom surface 412 of the flat plate portion 41. The plurality of concave portions 401 are provided in a grid shape with respect to the bottom surface 412.

The sealing resin 50 also enters the concave portion 401 while contacting the bottom surface 412. As a result, a bonded area between the sealing resin 50 and the flat plate portion 41 is increased, and the bonding strength between the sealing resin 50 and the flat plate portion 41 is increased. Therefore, the deformation of the flat plate portion 41 is further reduced or prevented, and the reliability of the electronic component module 10A is further improved.

Third Exemplary Embodiment

Figure 7:
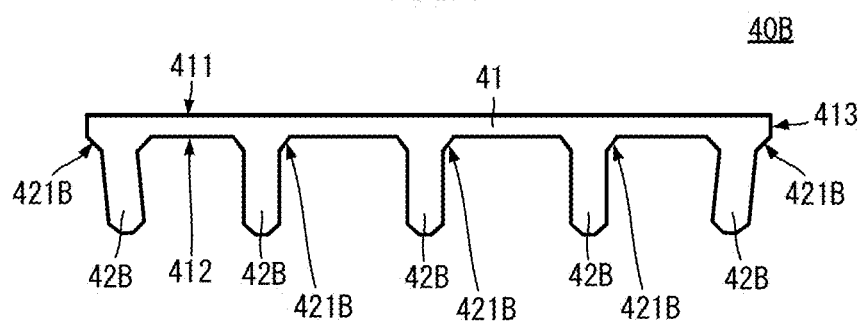
FIG. 7 is a side view showing a configuration of a heat dissipating member according to a third exemplary embodiment.

An electronic component module according to a third exemplary embodiment of the present invention will be described with reference to drawings. FIG. 7 is a side view showing a configuration of a heat dissipating member according to the third exemplary embodiment.

As shown in FIG. 7, an electronic component module according to the third exemplary embodiment is different in a shape of a heat dissipating member 40B from the electronic component module 10 according to the first exemplary embodiment. Other configurations of the electronic component module according to the third exemplary embodiment are the same as or similar to the configurations of the electronic component module 10, and a description of the same or similar configuration will be omitted.

The heat dissipating member 40B includes a flat plate portion 41 and a plurality of columnar bodies 42B. A cross-sectional area of a root portion 421B of a columnar body 42B is larger than a cross-sectional area of other portions of the columnar body 42B. According to this configuration, a bonded area between the columnar body 42B and the flat plate portion 41 is increased.

In a case in which the flat plate portion 41 deforms, the columnar body 42B receives the most stress in the root portion 421B bonded to the flat plate portion 41. However, with this configuration, the heat dissipating member 40B increases strength against the stress. Therefore, the reliability against breakage of the heat dissipating member 40B is improved, and the reliability of an electronic component module is improved.

Furthermore, in this configuration, a cross-sectional area of a portion into which the sealing resin 50 mainly flows, that is, a portion other than the root portion 421B in the columnar body 42B, is not increased. Therefore, the sealing resin 50 easily enters the periphery of the electronic component 31.

Fourth Exemplary Embodiment

Figure 8:
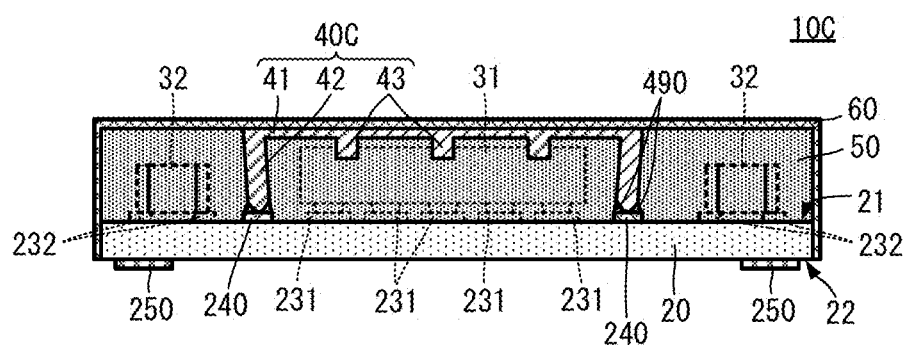
FIG. 8 is a side cross-sectional view showing a configuration of an electronic component module according to a fourth exemplary embodiment.
Figure 9A:
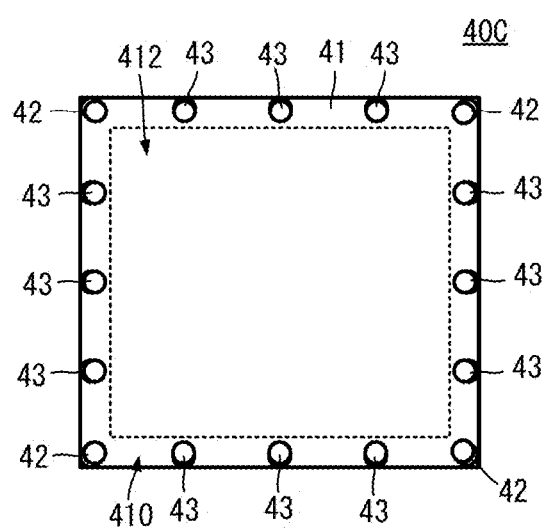
FIG. 9A is a plan view of a heat dissipating member according to the fourth exemplary embodiment.
Figure 9C:
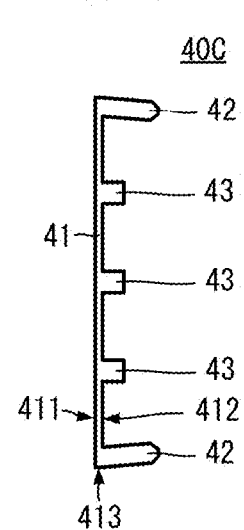
FIG. 9C is a second side view of the heat dissipating member.
Figure 9B:
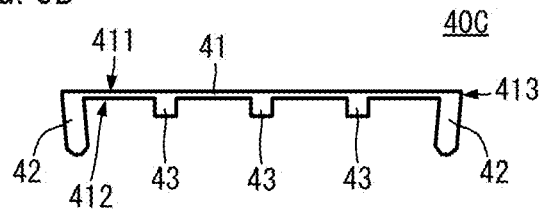
FIG. 9B is a first side view of the heat dissipating member.

An electronic component module according to a fourth exemplary embodiment will be described with reference to drawings. FIG. 8 is a side cross-sectional view showing a configuration of the electronic component module according to the fourth exemplary embodiment. FIG. 9A is a plan view of a heat dissipating member according to the fourth exemplary embodiment, FIG. 9B is a first side view of the heat dissipating member, and FIG. 9C is a second side view of the heat dissipating member.

As shown in FIG. 8, FIG. 9A, FIG. 9B, and FIG. 9C, an electronic component module 10C according to the fourth exemplary embodiment is different in a configuration of a heat dissipating member 40C from the electronic component module 10 according to the first exemplary embodiment. Other configurations of the electronic component module 10C are the same as or similar to the configurations of the electronic component module 10, and a description of the same or similar configuration will be omitted.

The electronic component module 10C includes a heat dissipating member 40C. The heat dissipating member 40C includes a flat plate portion 41, a plurality of columnar bodies 42, and a plurality of columnar bodies 43. The plurality of columnar bodies 42 and the plurality of columnar bodies 43 configure the "auxiliary portion" of the present disclosure.

The plurality of columnar bodies 42 are disposed at corner portions of the flat plate portion 41. The plurality of columnar bodies 42 correspond to a "first columnar body" of the present disclosure. The plurality of columnar bodies 42 are bonded to the heat dissipating member electrode 240 by use of the bonding material 490.

Moreover, the plurality of columnar bodies 43 are disposed along a side of the flat plate portion 41, and are disposed between the plurality of columnar bodies 42. The plurality of columnar bodies 43 correspond to a "second columnar body" of the present disclosure. A length of the plurality of columnar bodies 43 is smaller than a length of the plurality of columnar bodies 42. In this configuration, the plurality of columnar bodies 43 are disposed only up to an intermediate position in a thickness direction of the electronic component 31. Therefore, when the electronic component module 10C is viewed in a direction perpendicular to each side, the plurality of columnar bodies 43 do not overlap a portion on a side of the mounting surface in the electronic component 31. Therefore, the sealing resin 50 more easily enters the periphery of the electronic component 31.

Fifth Exemplary Embodiment

Figure 10A:
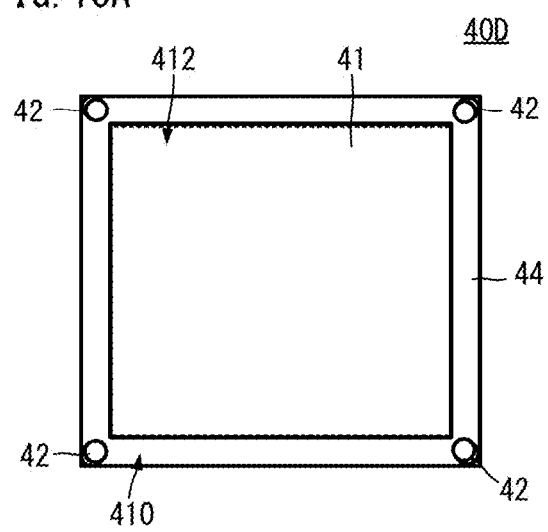
FIG. 10A is a plan view of a heat dissipating member according to a fifth exemplary embodiment.

An electronic component module according to a fifth exemplary embodiment of the present invention will be described with reference to drawings. FIG. 10A is a plan view of a heat dissipating member according to the fifth exemplary embodiment, FIG. 10B is a first side view of the heat dissipating member, and FIG. 10C is a second side view of the heat dissipating member.

Figure 10C:
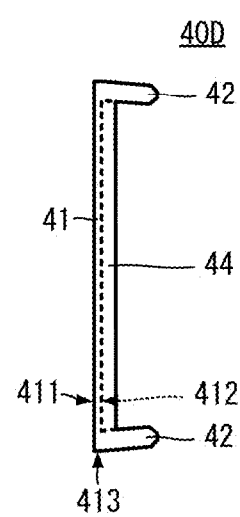
FIG. 10C is a second side view of the heat dissipating member.
Figure 10B:
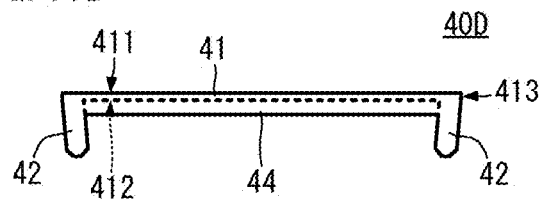
FIG. 10B is a first side view of the heat dissipating member.

As shown in FIG. 10A, FIG. 10B, and FIG. 10C, an electronic component module according to the fifth exemplary embodiment is different in a configuration of a heat dissipating member 40D from the electronic component module 10 according to the first exemplary embodiment. Other configurations of the electronic component module according to the fifth exemplary embodiment are the same as or similar to the configurations of the electronic component module 10, and a description of the same or similar configuration will be omitted.

The heat dissipating member 40D includes a flat plate portion 41, a plurality of columnar bodies 42, and a frame body 44. The plurality of columnar bodies 42 and the frame body 44 configure the "auxiliary portion" of the present disclosure.

As shown, the plurality of columnar bodies 42 are disposed at corner portions of the flat plate portion 41. The plurality of columnar bodies 42 are bonded to the heat dissipating member electrode 240 by use of the bonding material 490.

The frame body 44 is disposed so as to extend along a side of the flat plate portion 41. The frame body 44 is connected to each of the plurality of columnar bodies 42. A height (i.e., a length in a direction perpendicular to the bottom surface 412 of the flat plate portion 41) of the frame body 44 is smaller than the length of the plurality of columnar bodies 42. In this configuration, the frame body 44 is disposed only up to an intermediate position in the thickness direction of the electronic component 31. Therefore, when the electronic component module 10C is viewed in a direction perpendicular to each side, the frame body 44 does not overlap a portion on a side of the mounting surface in the electronic component 31. Therefore, the sealing resin 50 more easily enters the periphery of the electronic component 31.

In this manner, the auxiliary portion is not limited to a columnar body and may also include a frame body.

Sixth Exemplary Embodiment

Figure 11:
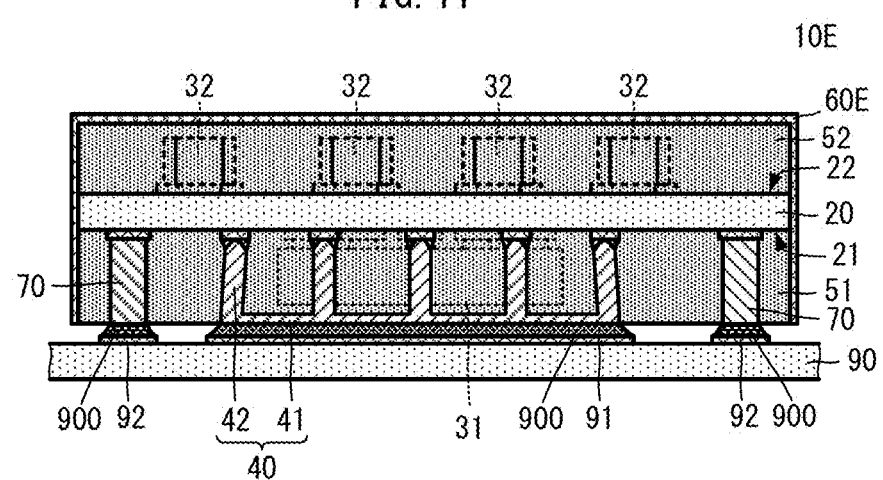
FIG. 11 is a side cross-sectional view showing a configuration of an electronic component module according to a sixth exemplary embodiment.

An electronic component module according to a sixth exemplary embodiment of the present invention will be described with reference to drawings. FIG. 11 is a side cross-sectional view showing a configuration of an electronic component module 10E according to the sixth exemplary embodiment of the present invention.

As shown in FIG. 11, the electronic component module 10E according to the sixth exemplary embodiment is different from the electronic component module 10 according to the first exemplary embodiment in that a substrate 20 is double-sided mounted. A description of a same portion in the electronic component module 10E as the portion of the electronic component module 10 will be omitted.

The electronic component module 10E includes a substrate 20, an electronic component 31, a plurality of electronic components 32, a heat dissipating member 40, a sealing resin 51, a sealing resin 52, a shield member 60E, and a plurality of post conductors 70. The plurality of electronic components 32 in the present exemplary embodiment correspond to a "third electronic component" of the present disclosure, the sealing resin 51 corresponds to a "first sealing resin" of the present disclosure, and the sealing resin 52 corresponds to a "second sealing resin" of the present disclosure.

The electronic component 31 is mounted on the first main surface 21 of the substrate 20. The plurality of electronic components 32 are mounted on the second main surface 22 of the substrate 20. The heat dissipating member 40 is mounted on the first main surface 21 of the substrate 20. The flat plate portion 41 of the heat dissipating member 40 is close to the electronic component 31. The plurality of post conductors 70 are disposed near the first main surface 21 of the substrate 20, and are connected to an electrode pattern of the substrate 20.

The sealing resin 51 covers a side of the first main surface 21 of the substrate 20. The sealing resin 51 covers the electronic component 31, the heat dissipating member 40, and the post conductor 70. However, a main surface of the flat plate portion 41 of the heat dissipating member 40 opposite to the electronic component 31, and the end surface of the plurality of post conductors 70 opposite to a connection portion to the substrate 20 are exposed from the sealing resin 51 to the outside.

The sealing resin 52 covers a side of the second main surface 22 of the substrate 20. Moreover, the sealing resin 52 covers the plurality of electronic components 32.

A shield member 60E covers a side surface of the substrate 20, the sealing resin 51, and the sealing resin 52. In such a case, the shield member 60E does not cover an externally exposed surface of the flat plate portion 41 of the heat dissipating member 40 or an externally exposed surface of the post conductor 70.

The electronic component module 10E of such a configuration is mounted on an external circuit board 90. The external circuit board 90 includes an electrode 91 and a plurality of electrodes 92. The flat plate portion 41 of the heat dissipating member 40 in the electronic component module 10E is bonded to the electrode 91 by use of a bonding material 900. The plurality of post conductors 70 are bonded to the plurality of electrodes 92 by use of the bonding material 900.

In such a manner, a shape of the heat dissipating member is also applicable to the double-sided mounting type electronic component module 10E. Then, in this configuration, heat generated by the electronic component 31 and propagated to the heat dissipating member 40 is propagated to the external circuit board 90. As a result, the heat dissipation property of the electronic component module 10E is improved.

Figure 12:
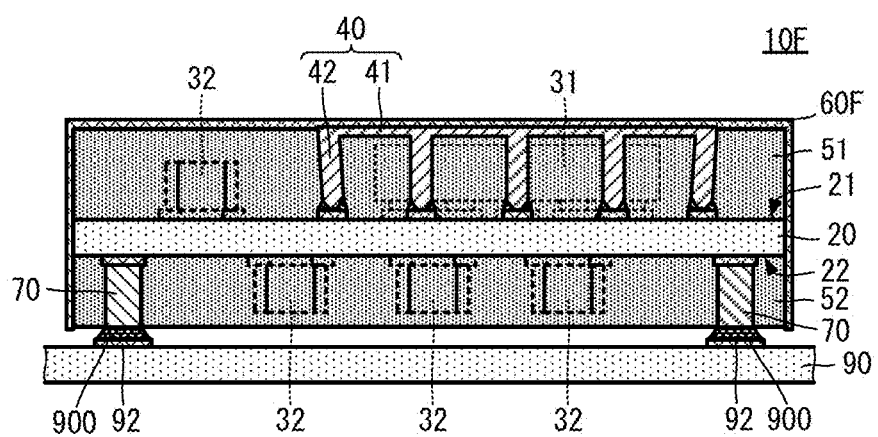
FIG. 12 is a side cross-sectional view showing a configuration of a modification of the electronic component module according to the sixth exemplary embodiment.
Figure 13:
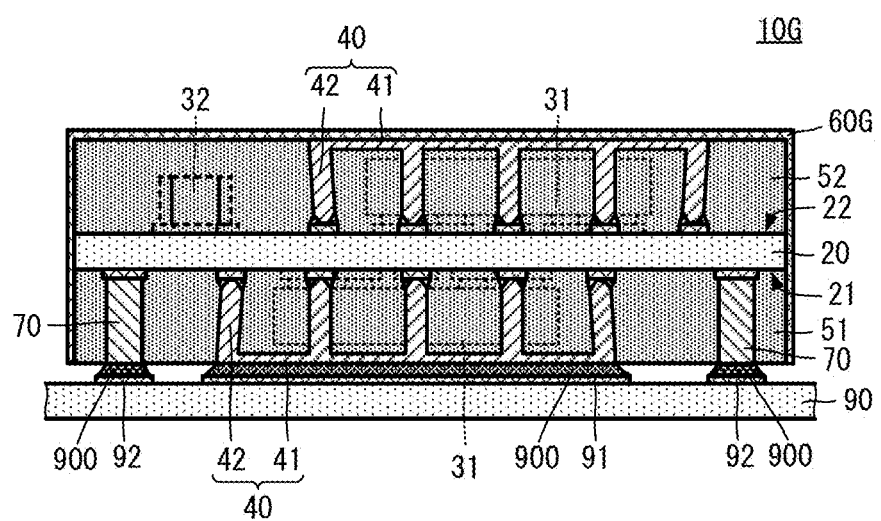
FIG. 13 is a side cross-sectional view showing a configuration of a modification of the electronic component module according to the sixth exemplary embodiment.

A modification of the sixth preferred embodiment may be shown in FIG. 12 and FIG. 13. FIG. 12 and FIG. 13 are side cross-sectional views showing a configuration of a modification of the electronic component module according to the sixth exemplary embodiment. It is noted that a shield member 60F of an electronic component module 10F and a shield member 60G of an electronic component module 10G have the same configuration as the shield member 60E of the electronic component module 10E.

As shown in FIG. 12, in the electronic component module 10F, the electronic components 31 and the heat dissipating member 40 are disposed near the first main surface of the substrate 20, and the plurality of electronic components 32 are disposed on the second main surface 22 of the substrate 20. The plurality of post conductors 70 are disposed near the second main surface 22 of the substrate 20. In other words, the second main surface of the substrate 20 is a mounting surface to the external circuit board 90, for example. In addition, as shown in FIG. 13, in the electronic component module 10G, the electronic component 31 and the heat dissipating member are disposed on both surfaces of the substrate 20, respectively.

It is also that the cross-sectional shape of the columnar body configuring the auxiliary portion is not limited to an ellipse. The columnar body configuring the auxiliary portion may have a prism-like shape, a plate-like shape, or any other suitable shape, for example. In addition, the configurations of the above-described exemplary embodiments are able to be appropriately combined, and the advantageous functions and effects according to each combination are able to be obtained.

REFERENCE SIGNS LIST 10, 10A, 10C, 10E: electronic component module
20: substrate
21: first main surface
22: second main surface
31, 32: electronic component
40, 40A, 40B, 40C, 40D, 40XA, 40XB, 40XC: heat dissipating member
41: flat plate portion
42, 42A, 42B, 42B1, 42B2, 42C1, 42C2, 43: columnar body
44: frame body
50, 51, 52: sealing resin
60 60E: shield member
70: post conductor
90: external circuit board
91, 92: electrode
231, 232: electronic component electrode
240: heat dissipating member electrode
250: external connection electrode
401: concave portion
410: outer peripheral portion
411: top surface
412: bottom surface
413: side surface
421 421B: root portion
422: tip portion
490, 900: bonding material
4220: tapered shape

What is claimed:
1. An electronic component module comprising:
a substrate including a first main surface and a second main surface that opposes each other;
a first electronic component mounted on the first main surface of the substrate and configured to generate heat;
a heat dissipating member that overlaps the first electronic component in a plan view of the first main surface of the substrate; and
a first sealing resin that covers the first main surface and the first electronic component and that includes a portion in contact with the heat dissipating member;
wherein the heat dissipating member includes:
a main body disposed opposite to the substrate with respect to the first electronic component; and
an auxiliary portion connected to an outer peripheral of the main body and that protrudes from the main body toward the substrate, with the auxiliary portion including:
a root connected to the main body, and
a tip on an opposite side of the root,
wherein at least a portion of the tip of the auxiliary portion is connected to the substrate, and
wherein the auxiliary portion, in a plan view of the main body, tilts so that a position of at least the portion of the tip is more inside the main body than a position of the root.

2. The electronic component module according to claim 1, wherein a space between the first electronic component and the heat dissipating member is filled with the first sealing resin.

3. The electronic component module according to claim 1, further comprising:
a second electronic component mounted on the first main surface,
wherein the main body overlaps the first electronic component and does not overlap the second electronic component.

4. The electronic component module according to claim 1, wherein the main body includes a surface exposed to an outside of the first sealing resin.

5. The electronic component module according to claim 1, wherein the main body has a thickness that is smaller than a width of the auxiliary portion.

6. The electronic component module according to claim 1, wherein the tip has a tapered shape.

7. The electronic component module according to claim 1, wherein the root of the auxiliary portion has a cross-sectional area that is larger than a cross-sectional area of at least the tip.

8. The electronic component module according to claim 1, wherein at least a portion of the auxiliary portion is configured by a plurality of columnar bodies disposed along an outer periphery of the main body.

9. The electronic component module according to claim 8, wherein:
the plurality of columnar bodies each have an elliptical cross-sectional shape; and
a length of the elliptical cross-sectional shape in a direction from an outside toward a center of the main body is longer than a length in a direction perpendicular to the direction.

10. The electronic component module according to claim 8, wherein the plurality of columnar bodies are disposed in a plurality of rows in a direction from an outside toward a center of the main body.

11. The electronic component module according to claim 8, wherein the plurality of columnar bodies have different cross-sections having a plurality of types of shapes.

12. The electronic component module according to claim 8, wherein the plurality of columnar bodies include:
a plurality of first columnar bodies disposed at each corner of the main body; and
a plurality of second columnar bodies different from the first columnar bodies among the plurality of columnar bodies, with the second columnar bodies being shorter than the first columnar bodies.

13. The electronic component module according to claim 8, wherein a distance between adjacent columnar bodies in the plurality of columnar bodies is less than or equal to half a wavelength of electromagnetic wave noise generated by the first electronic component.

14. The electronic component module according to claim 1, wherein a surface on a side of the first electronic component in the main body includes a concave portion.

15. The electronic component module according to claim 1, further comprising:
a third electronic component mounted on the second main surface; and
a second sealing resin disposed to cover the third electronic component.

16. The electronic component module according to claim 15, further comprising a heat dissipating member that overlaps the third electronic component, in a plan view of the second main surface of the substrate, wherein the second sealing resin further covers the second main surface and includes a portion in contact with the heat dissipating member.

17. The electronic component module according to claim 1, further comprising a conductive shield member that covers a front surface and a side surface of the sealing resin and a side surface of the substrate.

18. An electronic component module comprising:
a substrate including a main surface;
an electronic component mounted on the main surface of the substrate;
a heat dissipating member that overlaps the electronic component in a plan view of the main surface of the substrate; and
a sealing resin that covers the main surface of the substrate and the electronic component and that includes a portion that contacts the heat dissipating member,
wherein the heat dissipating member includes a flat plate and a plurality of columnar bodies that each have a root connected to the flat plate and a tip opposing the root,
wherein at least a portion of the tip is disposed at a position more inside the flat plate than a position of the root;
wherein the tip is connected to the substrate; and
wherein the flat plate, in a plan view of the heat dissipating member, tilts so that a position of at least the portion of the tip is more inside the main body than a position of the root.

19. The electronic component module according to claim 18, further comprising:
an additional electronic component mounted on the main surface of the substrate,
wherein the flat plate of the heat dissipating member overlaps the electronic component and does not overlap the additional electronic component.

* * * * *